United States Patent
Tanaka et al.

(10) Patent No.: US 12,347,651 B2
(45) Date of Patent: Jul. 1, 2025

(54) ETCHING METHOD AND PLASMA PROCESSING APPARATUS

(71) Applicant: Tokyo Electron Limited, Tokyo (JP)

(72) Inventors: Koki Tanaka, Miyagi (JP); Ryu Nagai, Miyagi (JP); Takatoshi Orui, Miyagi (JP); Ryutaro Suda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 423 days.

(21) Appl. No.: 17/469,895

(22) Filed: Sep. 9, 2021

(65) Prior Publication Data

US 2022/0093367 A1 Mar. 24, 2022

(30) Foreign Application Priority Data

Sep. 18, 2020 (JP) ................................. 2020-157282

(51) Int. Cl.
*H01J 37/32* (2006.01)

(52) U.S. Cl.
CPC .. *H01J 37/32449* (2013.01); *H01J 37/32495* (2013.01)

(58) Field of Classification Search
CPC ....... C23C 14/04; C23C 14/042; C23C 16/04; C23C 16/042; C23C 16/4404; C23C 16/4405; H01J 37/32091; H01J 37/32449; H01J 37/32477–32504; H01J 37/32862; H01J 2237/3342
See application file for complete search history.

(56) References Cited

U.S. PATENT DOCUMENTS

| | | | | |
|---|---|---|---|---|
| 5,085,727 | A * | 2/1992 | Steger | H01J 37/32495 156/914 |
| 6,071,573 | A | 6/2000 | Koemtzopoulos et al. | |
| 6,322,716 | B1 * | 11/2001 | Qiao | H01J 37/32862 216/67 |
| 7,204,913 | B1 * | 4/2007 | Singh | H01J 37/32862 156/345.55 |
| 10,128,085 | B2 * | 11/2018 | Wada | H01L 21/3081 |
| 2015/0155177 | A1 * | 6/2015 | Zhang | H01J 37/32357 438/719 |
| 2016/0020071 | A1 * | 1/2016 | Khaja | H01J 37/32357 427/569 |
| 2017/0062227 | A1 * | 3/2017 | Ishikawa | H01J 37/32009 |
| 2019/0198300 | A1 * | 6/2019 | Zhang | H01L 21/76843 |
| 2021/0111033 | A1 * | 4/2021 | Korolik | H01J 37/32633 |

FOREIGN PATENT DOCUMENTS

| | | |
|---|---|---|
| JP | 2008-519431 A | 6/2008 |
| JP | 2009-188257 A | 8/2009 |
| JP | 2016-76625 A | 5/2016 |
| JP | 2017-157627 A | 9/2017 |
| JP | 2018-046216 A | 3/2018 |
| JP | 2020520116 A | 7/2020 |
| JP | 2020-136669 A | 8/2020 |
| TW | 202032671 A | 9/2020 |
| WO | 2006/049954 A2 | 5/2006 |

* cited by examiner

*Primary Examiner* — Benjamin Kendall
(74) *Attorney, Agent, or Firm* — XSENSUS LLP (57) ABSTRACT

A disclosed etching method includes (a) forming a protective film on a surface in a chamber. The etching method further includes (b) etching an etch film of a substrate by using hydrogen fluoride within the chamber. The substrate includes the etch film and a mask provided on the etch film. The protective film is formed of the same type of material as a material of the mask.

19 Claims, 7 Drawing Sheets

ETCHING METHOD AND PLASMA PROCESSING APPARATUS

CROSS-REFERENCE TO RELATED APPLICATIONS

This application is based on and claims the benefit of priority from Japanese Patent Application No. 2020-157282 filed on Sep. 18, 2020, the entire contents of which are incorporated herein by reference.

FIELD

Exemplary embodiments of the present disclosure relate to a etching method and a plasma processing apparatus.

BACKGROUND

A plasma processing apparatus is used in plasma processing such as etching. The plasma processing apparatus is provided with a chamber. A surface in the chamber is exposed to reactive species that are used for plasma processing, and damaged by the reactive species. In order to protect the surface in the chamber from the reactive species, a technique for forming a protective film on the surface in the chamber before the plasma processing is performed on a substrate is used. Japanese Unexamined Patent Publication No. 2016-76625, Japanese Unexamined Patent Publication No. 2009-188257, and U.S. Pat. No. 6,071,573 disclose such a technique.

SUMMARY

In an exemplary embodiment, an etching method is provided. The etching method includes (a) forming a protective film on a surface in a chamber. The etching method further includes (b) etching an etch film of a substrate by using hydrogen fluoride within the chamber. The substrate includes the etch film and a mask provided on the etch film. The protective film is formed of the same type of material as a material of the mask.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Hereinafter, various exemplary embodiments will be described.

In an exemplary embodiment, an etching method is provided. The etching method includes (a) forming a protective film on a surface in a chamber. The etching method further includes (b) etching an etch film of a substrate by using hydrogen fluoride within the chamber. The substrate includes the etch film and a mask provided on the etch film. The protective film is formed of the same type of material as a material of the mask.

In the aforementioned embodiment, the protective film is formed on the surface in the chamber before the etching of the etch film using hydrogen fluoride. Since the protective film is formed of the same type of material as the material of the mask, it is resistant to the etching. Therefore, according to the aforementioned embodiment, it becomes possible to more effectively protect the surface in the chamber from the reactive species.

In an exemplary embodiment, the hydrogen fluoride may be generated from a processing gas that includes a hydrogen-containing gas and a fluorine-containing gas or includes hydrogen fluoride.

In an exemplary embodiment, the etch film may contain silicon, and the mask and the protective film may contain carbon. Alternatively, the etch film may contain metal.

In an exemplary embodiment, the mask may be formed of an amorphous carbon film.

In an exemplary embodiment, the etch film may include a silicon oxide film, a polycrystalline silicon film, a silicon nitride film, or a multilayer film that includes a silicon oxide film and a silicon nitride film.

In an exemplary embodiment, the protective film may be formed by using a gas containing hydrocarbon.

In an exemplary embodiment, the mask may be formed of a metal-containing film, and the protective film may contain metal.

In an exemplary embodiment, the mask and the protective film may be formed of polycrystalline silicon or silicon oxide.

In an exemplary embodiment, the etching method may further include (c) performing dry cleaning to remove a reaction product deposited on the protective film, together with at least a part of the protective film, after the operation (b).

In an exemplary embodiment, the dry cleaning may be performed such that the protective film partially remains in a state where the protective film covers the surface in the chamber. After the operation (c), the operation (b) may be further performed on another substrate.

In an exemplary embodiment, after the operation (b), the operation (a) may be further performed, and the operation (b) may be performed on another substrate.

In another exemplary embodiment, a plasma processing apparatus is provided. The plasma processing apparatus is provided with a chamber, a gas supply, a plasma generator, and a controller. The gas supply is configured to supply a gas into the chamber. The plasma generator is configured to generate plasma from a gas within the chamber. The controller is configured to control the gas supply and the plasma generator. The controller controls the gas supply to supply a film-forming gas into the chamber to form a protective film on a surface in the chamber. The controller controls the gas supply and the plasma generator to generate plasma from an etching gas to etch an etch film of a substrate by using hydrogen fluoride within the chamber. The film-forming gas contains a precursor that forms the protective film from the same type of material as a material of a mask provided on the etch film of the substrate.

Hereinafter, various exemplary embodiments will be described in detail with reference to the drawings. In the drawings, the same or equivalent portions are denoted by the same reference symbols.

Figure 1:
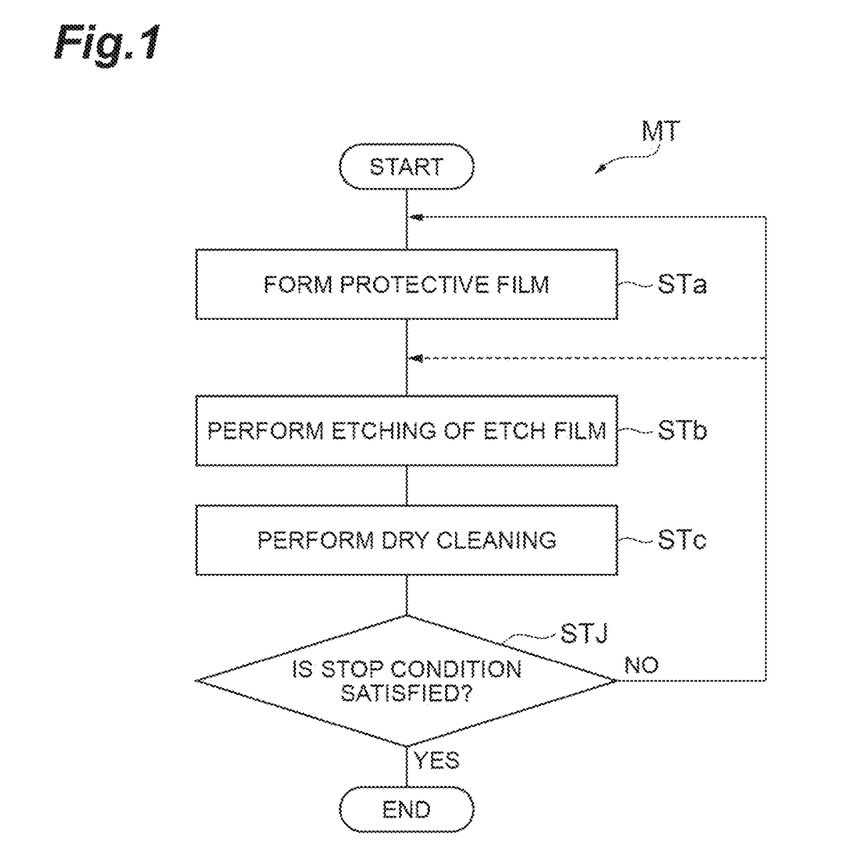
FIG. 1 is a flow chart of an etching method according to an exemplary embodiment.

FIG. 1 is a flow chart of an etching method according to an exemplary embodiment. The etching method (hereinafter referred to as a "method MT") shown in FIG. 1 is performed to etch an etch film of a substrate.

Figure 2:
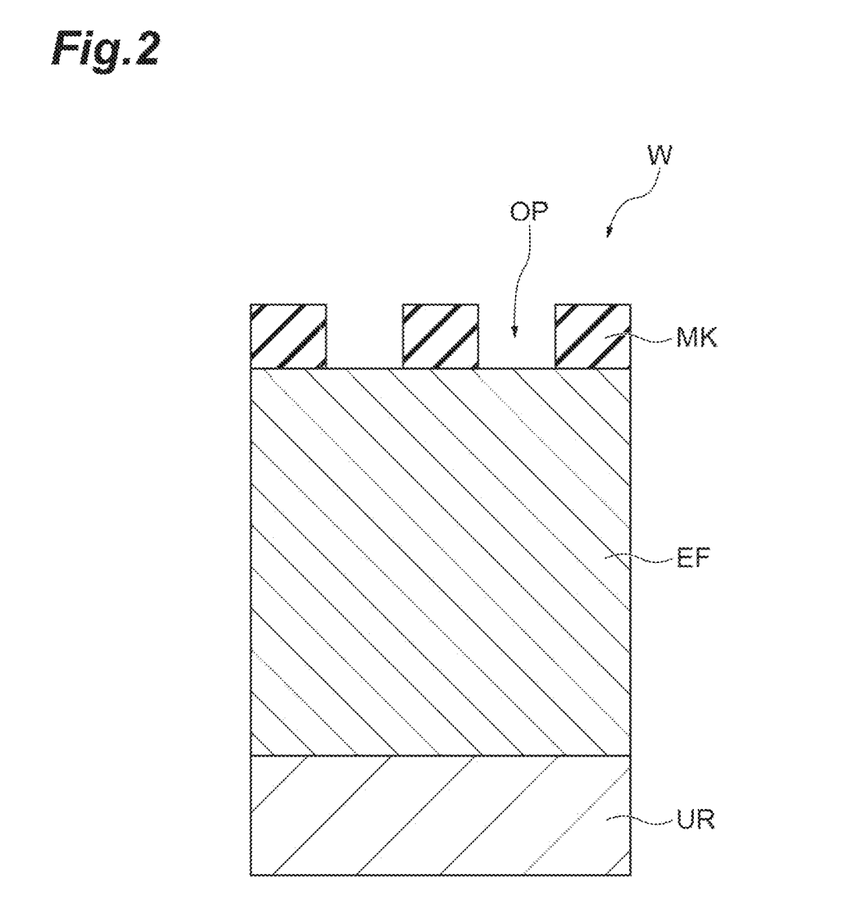
FIG. 2 is a partially enlarged sectional view of a substrate of an example.

FIG. 2 is a partially enlarged sectional view of a substrate of an example. The method MT may be applied to a substrate W shown in FIG. 2. The substrate W includes a film EF and a mask MK. The substrate W may further include an underlying region UR. The film EF may be provided on the underlying region UR.

The film EF is an etch film that is etched in the method MT. The film EF is, for example, a silicon-containing film. The silicon-containing film may be a monolayer film or a multilayer film. The monolayer film is, for example, a silicon oxide film, a silicon nitride film, a polycrystalline silicon film, or a silicon-containing low dielectric constant film. The multilayer film is formed of two or more films among a silicon oxide film, a silicon nitride film, and a polycrystalline silicon film. The multilayer film may be a laminated film that includes a silicon oxide film and a silicon nitride film. The film EF may be formed of other materials. For example, the film EF may be formed of metal.

The mask MK is provided on the film EF. The mask MK may be formed of any material as long as the film EF is selectively etched with respect to the mask MK. The mask MK is formed of, for example, an organic film such as a photoresist film, an amorphous carbon film, or a spin-on carbon film, a silicon-containing film, or a metal-containing film. The silicon-containing film is a polycrystalline silicon film or a silicon oxide film. The metal-containing film is formed of titanium, titanium nitride, titanium carbide, titanium oxide, tungsten, tungsten carbide, ruthenium, ruthenium oxide, molybdenum, molybdenum carbide, or the like. The mask MK has a pattern that is transferred to the film EF. That is, the mask MK provides an opening OP.

Figure 3:
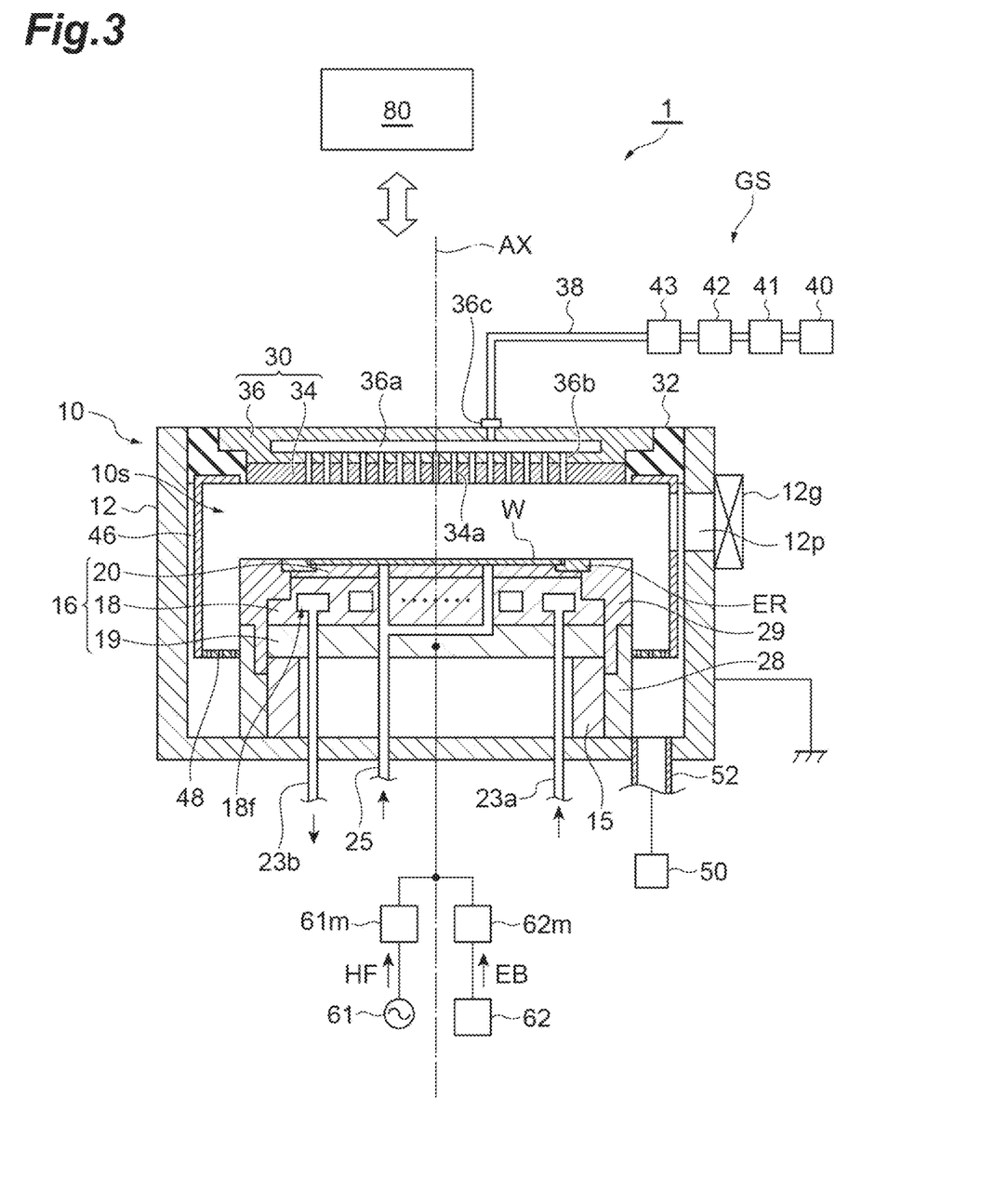
FIG. 3 schematically illustrates a plasma processing apparatus according to an exemplary embodiment.

In the method MT, a plasma processing apparatus is used. FIG. 3 is a diagram schematically illustrating a plasma processing apparatus according to an exemplary embodiment. A plasma processing apparatus 1 shown in FIG. 3 is a capacitively coupled plasma processing apparatus.

The plasma processing apparatus 1 is provided with a chamber 10. The chamber 10 provides an internal space 10s therein. The central axis of the chamber 10 is an axis AX which extends in the vertical direction. In an embodiment, the chamber 10 includes a chamber body 12. The chamber body 12 has a substantially cylindrical shape. The internal space 10s is provided in the chamber body 12. The chamber body 12 is formed of, for example, aluminum. The chamber body 12 is electrically grounded. A film having corrosion resistance is provided on the inner wall surface of the chamber body 12. The film having corrosion resistance may be a film formed of ceramic such as aluminum oxide or yttrium oxide.

The chamber body 12 provides a passage 12p in the side wall thereof. The substrate W passes through the passage 12p when it is transferred between the internal space 10s and the outside of the chamber 10. The passage 12p is able to be opened and closed by a gate valve 12g. The gate valve 12g is provided along the side wall of the chamber body 12.

The plasma processing apparatus 1 is further provided with a substrate support 16. The substrate support 16 is configured to support the substrate W in the chamber 10. The substrate W may have a substantially disk shape. The substrate support 16 may be supported by a support 15. The support 15 extends upward from a bottom portion of the chamber body 12. The support 15 has a substantially cylindrical shape. The support 15 is formed of an insulating material such as quartz.

The substrate support 16 may include a lower electrode 18 and an electrostatic chuck 20. The substrate support 16 may further include an electrode plate 19. The electrode plate 19 is formed of a conductive material such as aluminum. The electrode plate 19 has a substantially disk shape, and the central axis thereof is the axis AX. The lower electrode 18 is provided on the electrode plate 19. The lower electrode 18 is formed of a conductive material such as aluminum. The lower electrode 18 has a substantially disk shape, and the central axis thereof is the axis AX. The lower electrode 18 is electrically connected to the electrode plate 19.

A flow path 18f is provided in the interior of the lower electrode 18. The flow path 18f is a flow path for a heat exchange medium (for example, a refrigerant). The flow path 18f receives the heat exchange medium from a supply device (for example, a chiller unit) through a pipe 23a. The supply device is provided outside the chamber 10. The heat exchange medium supplied to the flow path 18f flows through the flow path 18f and is then returned to the supply device through a pipe 23b. The supply device for the heat exchange medium configures a temperature adjusting mechanism of the plasma processing apparatus 1.

The electrostatic chuck 20 is provided on the lower electrode 18. The substrate W is placed on the upper surface of the electrostatic chuck 20. The electrostatic chuck 20 has a main body and an electrode. The main body of the electrostatic chuck 20 is formed of a dielectric. Each of the electrostatic chuck 20 and the main body thereof has a substantially disk shape, and the central axis thereof is the axis AX. The electrode of the electrostatic chuck 20 is an electrode having a film shape, and is provided in the main body of the electrostatic chuck 20. The electrode of the electrostatic chuck 20 is connected to a direct-current power source through a switch. When the voltage from the direct-current power source is applied to the electrode of the electrostatic chuck 20, an electrostatic attraction force is generated between the electrostatic chuck 20 and the substrate W. Due to the generated electrostatic attraction force, the substrate W is attracted to the electrostatic chuck 20 and held by the electrostatic chuck 20.

The substrate support 16 may further support an edge ring ER that is disposed thereon. The edge ring ER may be formed of silicon, silicon carbide, or quartz. The substrate W is disposed on the electrostatic chuck 20 and in a region surrounded by the edge ring ER.

The plasma processing apparatus 1 may be further provided with a gas supply line 25. The gas supply line 25 supplies a heat transfer gas (for example, a He gas) from a gas supply mechanism to a gap between the upper surface of the electrostatic chuck 20 and the rear surface (lower surface) of the substrate W.

The plasma processing apparatus 1 may further include a tubular part 28 and an insulating part 29. The tubular part 28 extends upward from the bottom portion of the chamber body 12. The tubular part 28 extends along the outer periphery of the support 15. The tubular part 28 is formed of a conductive material and has a substantially cylindrical shape. The tubular part 28 is electrically grounded. The insulating part 29 is provided on the tubular part 28. The insulating part 29 is formed of a material having insulation properties. The insulating part 29 is formed of ceramic such as quartz, for example. The insulating part 29 has a substantially cylindrical shape. The insulating part 29 extends along the outer periphery of the electrode plate 19, the outer periphery of the lower electrode 18, and the outer periphery of the electrostatic chuck 20.

The plasma processing apparatus 1 is further provided with an upper electrode 30. The upper electrode 30 is provided above the substrate support 16. The upper electrode 30 is supported on an upper portion of the chamber body 12 through a member 32. The member 32 is formed of a material having insulation properties. The upper electrode 30 and the member 32 close the upper opening of the chamber body 12.

The upper electrode 30 may include a ceiling plate 34 and a support 36. The lower surface of the ceiling plate 34 is a lower surface on the internal space 10s side and defines the internal space 10s. The ceiling plate 34 may be formed of a low resistance conductor or semiconductor with low Joule heat. In an embodiment, the ceiling plate 34 is formed of silicon. A plurality of gas holes 34a are provided in the ceiling plate 34. The plurality of gas holes 34a penetrate the ceiling plate 34 in a plate thickness direction thereof.

The support 36 detachably supports the ceiling plate 34. The support 36 is formed of a conductive material such as aluminum. The support 36 provides a gas diffusion chamber 36a in the interior thereof. The support 36 is further provided with a plurality of gas holes 36b. The plurality of gas holes 36b extend downward from the gas diffusion chamber 36a. The plurality of gas holes 36b communicate with the plurality of gas holes 34a, respectively. The support 36 is further provided with a gas introduction port 36c. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply GS. The gas source group 40 includes a plurality of gas sources. The plurality of gas sources of the gas source group 40 include sources of a plurality of gases that are used in the method MT. Each of the valve group 41 and the valve group 43 includes a plurality of on-off valves. The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding on-off valve of the valve group 41, a corresponding flow rate controller of the flow rate controller group 42, and a corresponding on-off valve of the valve group 43.

The plasma processing apparatus 1 may be further provided with a shield 46. The shield 46 is detachably provided along the inner wall surface of the chamber body 12. The shield 46 prevents byproducts of the plasma processing from adhering to the chamber body 12. The shield 46 is configured, for example, by forming a film having corrosion resistance on the surface of a member made of aluminum. The film having corrosion resistance may be a film formed of ceramic such as yttrium oxide.

The plasma processing apparatus 1 may be further provided with a baffle member 48. The baffle member 48 is provided between a member (for example, the tubular part 28) that surrounds the substrate support 16, and the shield 46. The baffle member 48 is configured, for example, by forming a film having corrosion resistance on the surface of a member made of aluminum. The film having corrosion resistance may be a film formed of ceramic such as yttrium oxide. A plurality of through-holes are provided in the baffle member 48. An exhaust port is provided below the baffle member 48 and in the bottom portion of the chamber body 12. An exhaust device 50 is connected to the exhaust port through an exhaust pipe 52. The exhaust device 50 has a pressure adjusting valve, and a vacuum pump such as a turbo molecular pump.

The plasma processing apparatus 1 is further provided with a radio frequency power source 61 and a bias power source 62. The radio frequency power source 61 is configured to generate radio frequency power (hereinafter referred to as "radio frequency power HF"). The radio frequency power HF has a frequency suitable for the generation of plasma. The frequency of the radio frequency power HF is, for example, 27 MHz or higher and 100 MHz or lower. The radio frequency power source 61 is connected to the lower electrode 18 through a matcher 61m. The matcher 61m has a circuit for matching the impedance on the load side (the lower electrode 18 side) of the radio frequency power source 61 with the output impedance of the radio frequency power source 61. In an embodiment, the radio frequency power source 61 may configure a plasma generator. The radio frequency power source 61 may be connected to the upper electrode 30 through the matcher 61m.

The bias power source 62 is configured to supply an electric bias EB to the lower electrode 18. The electric bias EB has a frequency suitable for drawing ions into the substrate W. The frequency of the electric bias EB is, for example, 100 kHz or higher and 40.68 MHz or lower. In a case where the electric bias EB is used together with the radio frequency power HF, the electric bias EB has a frequency lower than the frequency of the radio frequency power HF.

In an embodiment, the electric bias EB may be radio frequency bias power (hereinafter referred to as "radio frequency power LF"). In the present embodiment, the bias power source 62 is connected to the lower electrode 18 through a matcher 62m. The matcher 62m has a circuit for matching the impedance on the load side (the lower electrode 18 side) of the bias power source 62 with the output impedance of the bias power source 62. The plasma processing apparatus 1 may be configured to generate plasma by using only the radio frequency power LF. In this case, the bias power source 62 configures the plasma generator in an embodiment. In this case, the plasma processing apparatus 1 does not need to be provided with the radio frequency power source 61 and the matcher 61m.

In an embodiment, the electric bias EB may be a pulse of a negative direct-current voltage. In the present embodiment, the pulse of the negative direct-current voltage is periodically applied to the lower electrode 18.

The plasma processing apparatus 1 is further provided with a controller 80. The controller 80 is a computer which includes a processor, a storage device, an input device, a display device, and the like, and controls each part of the plasma processing apparatus 1. Specifically, the controller 80 executes a control program stored in the storage device and controls each part of the plasma processing apparatus 1, based on recipe data stored in the storage device. A process designated by the recipe data is performed in the plasma processing apparatus 1 under the control by the controller 80. The method MT can be performed in the plasma processing apparatus 1 by the control of each part of the plasma processing apparatus 1 by the controller 80.

Figure 4:
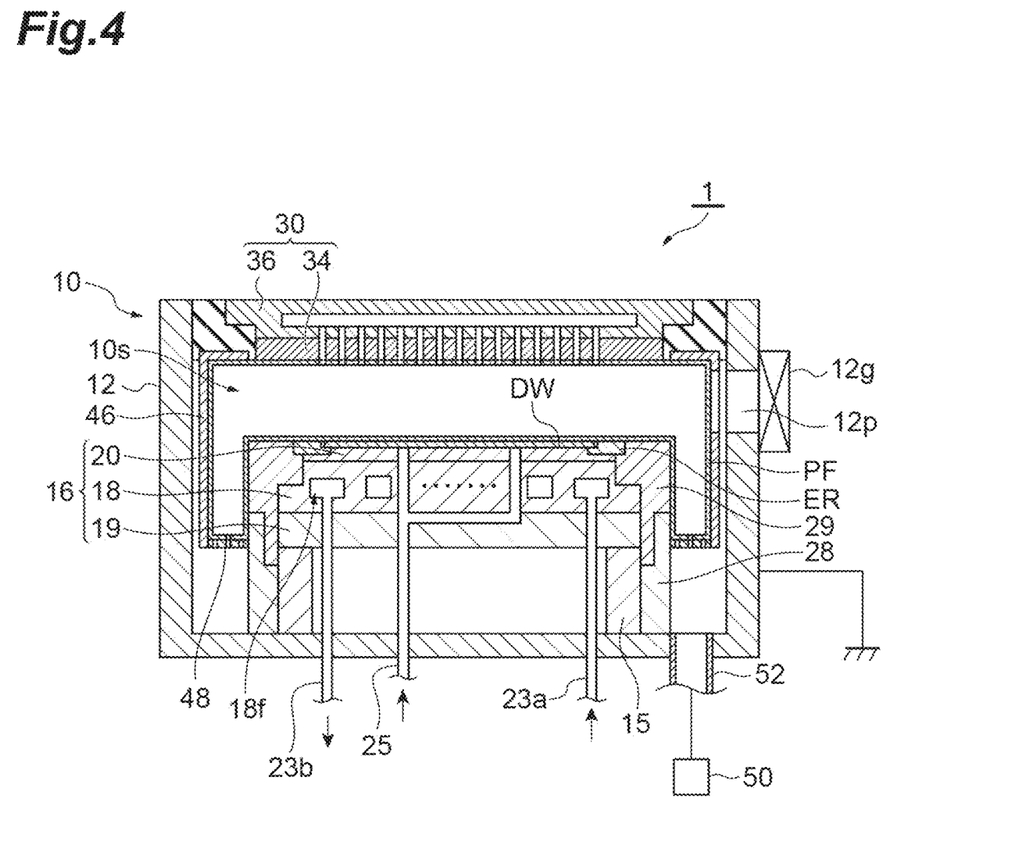
FIG. 4 illustrates a state where a protective film is formed on a surface in a chamber of the plasma processing apparatus according to an exemplary embodiment.
Figure 5:
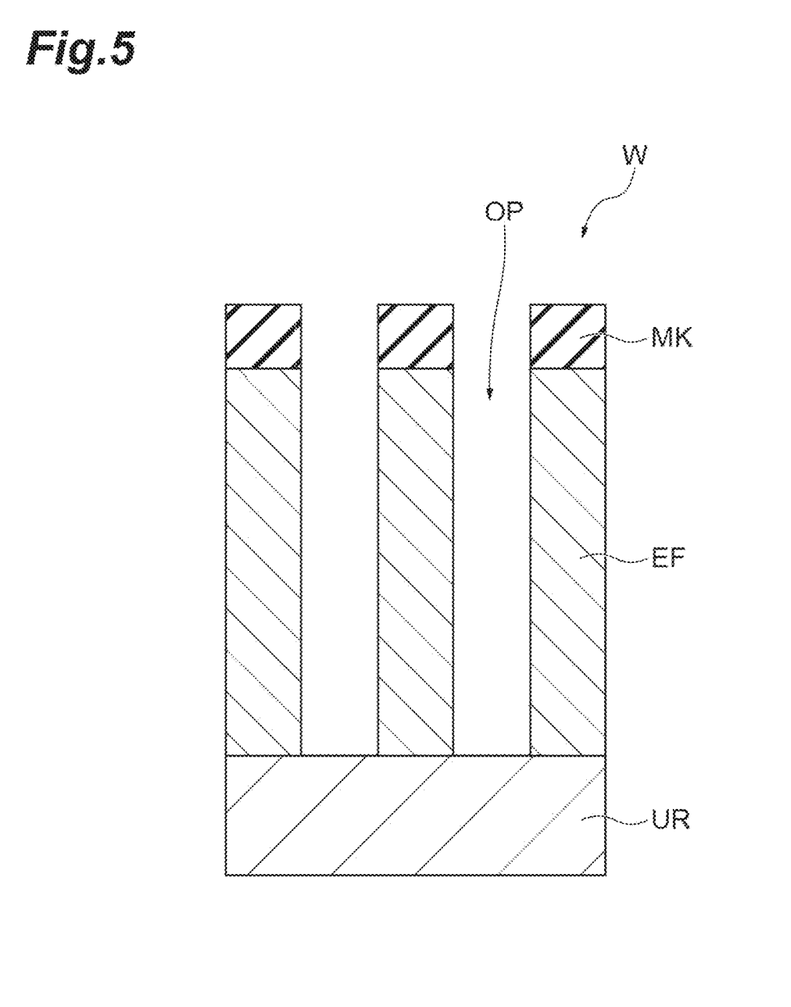
FIG. 5 is a partially enlarged sectional view of a substrate of an example in the state after etching is performed.
Figure 6:
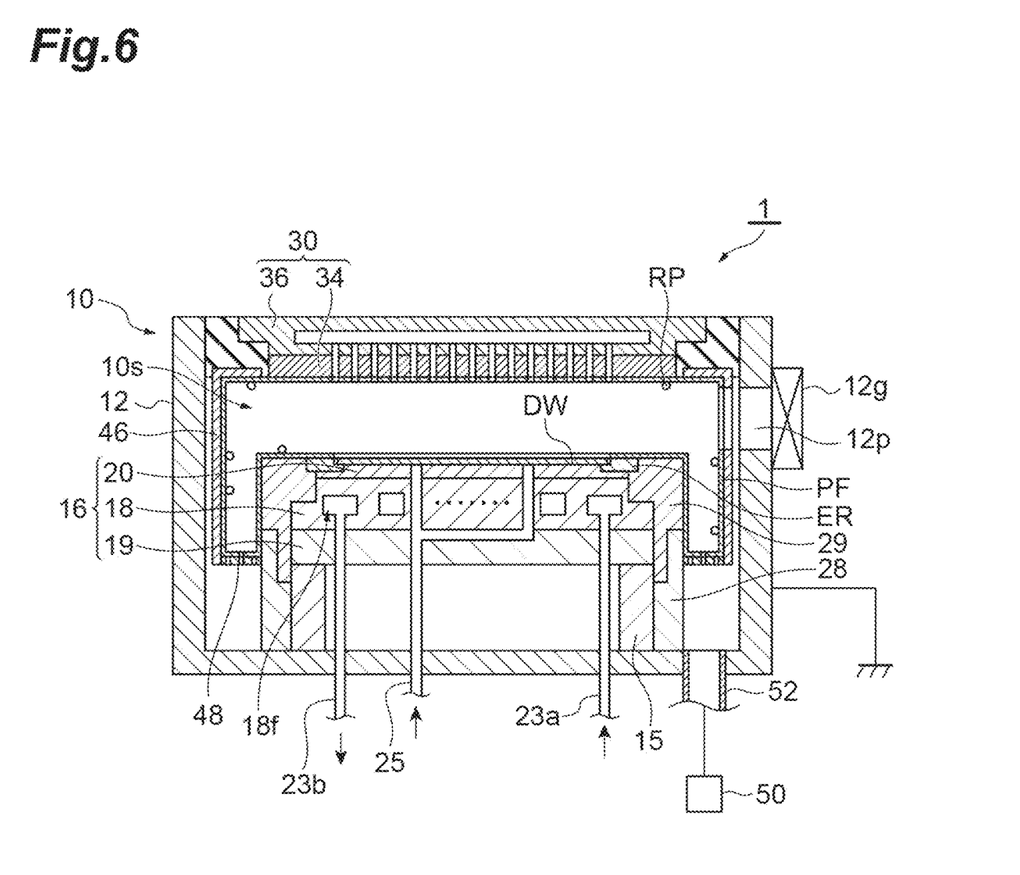
FIG. 6 illustrates the state of the chamber after etching is performed in the plasma processing apparatus according to an exemplary embodiment.
Figure 7:
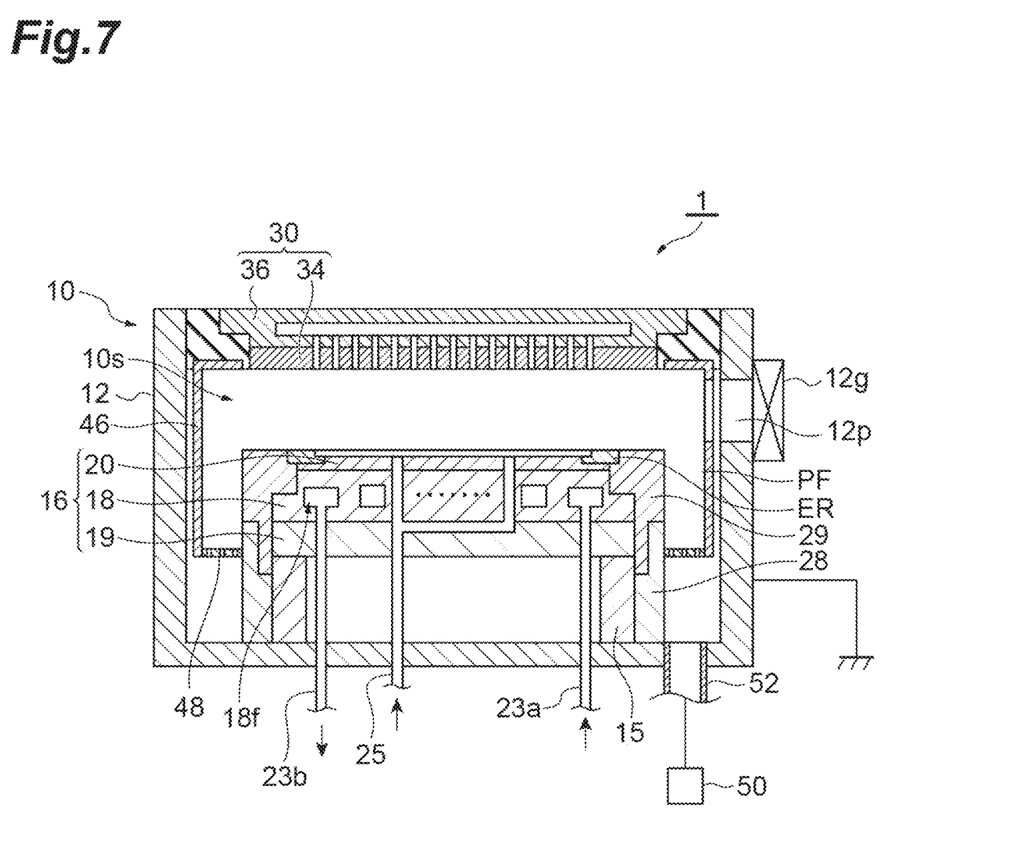
FIG. 7 illustrates the state of the chamber after dry cleaning is performed in the plasma processing apparatus according to an exemplary embodiment.

The method MT will be described in detail with reference to FIG. 1 again. Hereinafter, the method MT will be described by taking a case where the method MT is applied to the substrate W shown in FIG. 2 by using the plasma processing apparatus 1 as an example. In the following description, FIGS. 4 to 7 will be further referred to. FIG. 4 is a diagram showing a state where a protective film is formed on the surface in the chamber of the plasma processing apparatus according to an exemplary embodiment. FIG. 5 is a partially enlarged sectional view of a substrate of an example in a state after etching is performed. FIG. 6 is a diagram showing the state of the chamber after etching is performed in the plasma processing apparatus according to an exemplary embodiment. FIG. 7 is a diagram showing the state of the chamber after dry cleaning is performed in the plasma processing apparatus according to an exemplary embodiment.

As shown in FIG. 1, the method MT starts with step STa. In step STa, as shown in FIG. 4, a protective film PF is formed on the surface in the chamber 10. The surface in the chamber 10 is a surface to which a reaction product that is generated in the etching of step STb (described later) may adhere unless the protective film PF is formed on the surface. In an example, the surface in the chamber 10 includes the lower surface of the upper electrode 30 (that is, the lower surface of the ceiling plate 34), the surface of the shield 46, the surface of the insulating part 29, and the surface of the edge ring ER. As shown in FIG. 4, step STa may be performed in a state where a dummy substrate DW is placed on the substrate support 16.

The protective film PF is formed of the same type of material as the material of the mask MK. In a case where the mask MK is formed of an organic film, the protective film PF is formed of a carbon-containing substance. In a case where the mask MK is formed of a silicon-containing film, the protective film PF is formed of a silicon-containing substance (for example, polycrystalline silicon, silicon oxide, or a silicon-containing film containing carbon). In a case where the mask MK is formed of a metal-containing film, the protective film PF is formed of a metal-containing substance. The metal-containing substance includes any one of titanium, titanium nitride, titanium carbide, titanium oxide, tungsten, tungsten carbide, ruthenium, ruthenium oxide, molybdenum, molybdenum carbide, and the like.

The protective film PF made of a carbon-containing substance is formed by using a film-forming gas within the chamber 10. The film-forming gas includes a carbon-containing gas. The film-forming gas may be a gas that does not contain fluorine. The carbon-containing gas contains one or more substances among CO, $CO_2$, COS, and hydrocarbon, as precursors. The hydrocarbon is $CH_4$, $C_2H_2$, $C_3H_6$, or the like. The protective film PF made of a carbon-containing substance may be formed by a chemical vapor deposition (CVD) method or a molecular layer deposition (MLD) method. The CVD method may be a plasma-enhanced CVD method or a thermal CVD method. The MLD method may be a plasma-enhanced MLD method or a thermal MLD method. In the MLD method, a protective film having a urea bond can be formed by mixing two or more types of gases.

In step STa, the controller 80 controls the gas supply GS to supply the film-forming gas into the chamber 10 to form the protective film PF made of a carbon-containing substance. The controller 80 controls the exhaust device 50 to set the pressure of the gas in the chamber 10 to a designated pressure. The controller 80 controls the plasma generator to generate plasma of the film-forming gas within the chamber 10. In the plasma processing apparatus 1, the controller 80 controls the radio frequency power source 61 and/or the bias power source 62 to supply the radio frequency power HF and/or the electric bias EB.

The protective film PF made of a silicon-containing substance is formed by using a CVD method or an atomic layer deposition (ALD) method. The CVD method may be a plasma-enhanced CVD method or a thermal CVD method. The ALD method may be a plasma-enhanced ALD method or a thermal ALD method. The controller 80 controls the gas supply GS to supply a film-forming gas containing a silicon-containing substance as a precursor into the chamber 10 to form the protective film PF made of a silicon-containing substance in step STa. In a case of forming the protective film PF made of a silicon-containing substance, the film-forming gas contains, for example, $SiH_4$, $SiCl_4$, $Si_2Cl_6$, or $SiF_4$. The film-forming gas may further contain a rare gas such as argon. In a case of forming the protective film PF made of silicon oxide, an oxygen-containing gas containing oxygen that reacts with a precursor may be further used.

The protective film PF made of a metal-containing substance is formed by using a chemical vapor deposition method, a metalorganic chemical vapor deposition (MOCVD) method, or an atomic layer deposition (ALD) method. In a case of using these film-forming methods, the film-forming gas containing a metal-containing substance as a precursor is supplied into the chamber 10. The film-forming gas contains, for example, $WF_6$, $TiCl_4$, $C_8H_{24}N_4Ti$, $RuCl_3$, or $MoCl_5$. The controller 80 controls the gas supply GS to supply the film-forming gas into the chamber 10 to form the protective film PF made of a metal-containing substance in step STa.

In a case where the protective film PF is formed of tungsten, the film-forming gas may contain $WF_6$. The film-forming gas is supplied into the chamber 10 such that $WF_6$ that is a precursor is adsorbed to the surface in the chamber 10. $WF_6$ is modified by the chemical species from plasma of a hydrogen-containing gas (for example, an $H_2$ gas) that is generated within the chamber 10. As a result, the protective film PF made of tungsten is formed on the surface in the chamber 10. Alternatively, the protective film PF made of tungsten may be formed by a plasma-enhanced CVD method or a thermal CVD method using a film-forming gas containing $WF_6$.

In a case where the protective film PF is formed of titanium, the film-forming gas contains, for example, $TiCl_4$ and $H_2$, and the protective film PF is formed by a plasma-enhanced CVD method or a thermal CVD method. In a case where the protective film PF is formed of titanium nitride, the film-forming gas contains, for example, $TiCl_4$ and $N_2$, and the protective film PF is formed by a plasma-enhanced CVD method or a thermal CVD method. Alternatively, in a case where the protective film PF is formed of titanium nitride, the film-forming gas contains, for example, $Ti[N(CH_3)C_2H_5]_4$, and the protective film PF is formed by an MOCVD method.

In the method MT, subsequently, the substrate W is placed on the substrate support 16. Then, step STb is performed. In step STb, the film EF is etched as shown in FIG. 5. Due to the etching of the film EF in step STb, the depth of the opening OP increases. In step STb, the film EF may be etched to a state where the underlying region UR is exposed.

In step STb, the film EF is etched by using hydrogen fluoride within the chamber 10. In step STb, an etching gas is supplied into the chamber 10, and plasma is generated from the etching gas within the chamber 10, to produce the hydrogen fluoride.

The etching gas may contain hydrogen fluoride (HF). Alternatively, the etching gas may include a fluorine-containing gas that is a fluorine source, and a hydrogen-containing gas that is a hydrogen source. The etching gas may contain one or more substances among $H_2$, $CH_4$, $CH_2F_2$, $CH_3F$, $CHF_3$, $H_2O$, HF, HCl, HBr, HI, and the like, as a hydrogen source. The etching gas may contain one or more substances among $CF_4$, $C_4F_8$, $C_4F_6$, $C_3F_8$, $C_5F_8$, $SF_6$, $NF_3$, $XeF_2$, $PF_3$, $PF_5$, $CF_3I$, $C_2F_5I$, $C_3F_7I$, $IF_5$, $IF_7$, $WF_6$, HF, $SiF_4$, and the like, as a fluorine source.

The etching gas may further contain one or more phosphorus-containing molecules. One or more phosphorus-containing molecules may contain oxides such as tetraphosphorus pentoxide ($P_4O_{10}$), tetraphosphorus octoxide ($P_4O_8$), and tetraphosphorus hexaoxide ($P_4O_6$). The tetraphosphorus pentoxide is sometimes called diphosphorus pentoxide ($P_2O_5$). One or more phosphorus-containing molecules may contain halides such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), and phosphorus iodide ($PI_3$). One or more phosphorus-containing molecules may contain halogenated phosphoryl such as phosphoryl fluoride ($POF_3$), phosphoryl chloride ($POCl_3$), and phosphoryl bromide ($POBr_3$). One or more phosphorus-containing molecules may contain phosphine ($PH_3$), calcium phosphide ($Ca_3P_2$ or the like), phosphoric acid ($H_3PO_4$), sodium phosphate ($Na_3PO_4$), a hexafluorophosphoric acid ($HPF_6$), and the like. One or more phosphorus-containing molecules may contain fluorophosphine ($H_xPF_y$). Here, the sum of x and y is 3 or 5. As the fluorophosphine, $HPF_2$ and $H_2PF_3$ are exemplified.

In an example, the etching gas may be a mixed gas containing a hydrogen fluoride gas, a fluorocarbon gas such as a $C_4F_8$ gas, and a phosphorus-containing gas. The phosphorus-containing gas contains the one or more phosphorus-containing molecules described above.

In order to etch the film EF in step STb, the controller 80 controls the gas supply GS to supply the etching gas into the chamber 10. The controller 80 controls the exhaust device 50 to set the pressure of the gas in the chamber 10 to a designated pressure. The controller 80 controls the plasma generator to generate plasma of the etching gas within the chamber 10. In the plasma processing apparatus 1, the controller 80 controls the radio frequency power source 61 and/or the bias power source 62 to supply the radio frequency power HF and/or the electric bias EB.

When the etching in step STb is performed, a reaction product RP is produced. The reaction product RP adheres to the surface in the chamber 10, as shown in FIG. 6.

In the method MT, the substrate W is carried out from the inside of the chamber 10 after step STb. Then, step STc is performed. In step STc, dry cleaning of the chamber 10 is performed. The dry cleaning in step STc may be performed in a state where a dummy substrate is placed or is not placed on the substrate support 16.

In step STc, a cleaning gas is supplied into the chamber 10 and plasma is generated from the cleaning gas. The reaction product RP is removed together with at least a part of the protective film PF by the generated chemical species from the cleaning gas. The dry cleaning in step STc may completely remove the protective film PF, as shown in FIG. 7. Alternatively, the dry cleaning in step STc may be performed such that the protective film PF partially remains in a state where the protective film PF covers the surface in the chamber 10.

In a case where the protective film PF is made of a carbon-containing substance, an oxygen-containing gas (for example, an $O_2$ gas) is used as the cleaning gas. In a case where the protective film PF is made of a silicon-containing substance, a halogen-containing gas is used as the cleaning gas. In a case where the protective film PF is made of a metal-containing substance, the cleaning gas contains $NF_3$, $Cl_2$, $BCl_3$, $SiCl_4$, $O_2$, $CH_3OH$, $C_2H_5OH$, or the like.

In order to perform the dry cleaning in step STc, the controller 80 controls the gas supply GS to supply the cleaning gas into the chamber 10. The controller 80 controls the exhaust device 50 to set the pressure of the gas in the chamber 10 to a designated pressure. The controller 80 controls the plasma generator to generate plasma of the cleaning gas within the chamber 10. In the plasma processing apparatus 1, the controller 80 controls the radio frequency power source 61 and/or the bias power source 62 to supply the radio frequency power HF and/or the electric bias EB.

The method MT may further include step STJ. In step STJ, it is determined whether or not a stop condition is satisfied. The stop condition is not satisfied in a case where there is a substrate to be further etched. On the other hand, the stop condition is satisfied in a case where the etching for all the substrates is completed.

When a determination that the stop condition is not satisfied is made in step STJ, the processing is continued for the etching of another substrate W. In a case where the protective film PF has been removed by the dry cleaning in step STc to expose the surface in the chamber 10, step STa is performed again. Thereafter, another substrate W is placed on the substrate support 16 and step STb is performed. Alternatively, in a case where the protective film PF remains to cover the surface in the chamber 10 after the dry cleaning in step STc, another substrate W is placed on the substrate support 16 without performing step STa, and then, step STb is performed. When a determination that the stop condition is satisfied is made in step STJ, the method MT is ended.

In the method MT, the protective film PF is formed on the surface in the chamber 10 before the etching of the film EF using hydrogen fluoride. Since the protective film PF is formed of the same type of material as the material of the mask MK, it is resistant to the etching. Therefore, according to the method MT, it becomes possible to more effectively protect the surface in the chamber 10 from the reactive species. As a result, corrosion of the surface in the chamber 10 due to the etching in step STc is prevented. Furthermore, a temporal change of the process (step STc) is prevented. Further, according to the method MT, since the surface in the chamber 10 is protected by the protective film PF, a sputtering resistant effect of the surface in the chamber 10 can be obtained, and scattering of particles of the material configuring the surface in the chamber 10 can be prevented.

While various exemplary embodiments have been described above, various additions, omissions, substitutions and changes may be made without being limited to the exemplary embodiments described above. Elements of the different embodiments may be combined to form another embodiment.

For example, the plasma processing apparatus that is used for the method MT may be a capacitively coupled plasma processing apparatus different from the plasma processing apparatus 1. The plasma processing apparatus that is used for the method MT may be a plasma processing apparatus of a type different from the capacitively coupled type. Such a plasma processing apparatus is, for example, an inductively coupled plasma processing apparatus, an electron cyclotron resonance (ECR) plasma processing apparatus, or a plasma processing apparatus that generates plasma from a gas by surface waves such as microwaves.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims

What is claimed is:

1. A plasma processing apparatus comprising:
   a chamber having a plasma processing space therein,
   a gas supply configured to supply a gas into the plasma processing space in the chamber,
   a plasma generator configured to generate plasma from the gas within the plasma processing space in the chamber; and
   a controller configured to control the gas supply and the plasma generator,
   wherein the controller is configured to
   (a) control the gas supply to supply a film-forming gas into the plasma processing space in the chamber to form a protective film on a surface in the chamber,
   (b) control the gas supply and the plasma generator to generate plasma from an etching gas to etch an etch film of a substrate by using hydrogen fluoride and one or more phosphorus-containing molecules within the plasma processing space in the chamber, and
   (c) perform dry cleaning to remove a reaction product deposited on the protective film, together with at least a part of the protective film, after the substrate which is in a state where an upper surface of an underlying region has been exposed by the etching in said (b) is transferred out from the chamber, and
   the film-forming gas contains a precursor that forms the protective film from a same type of material as a material of a mask provided on the etch film of the substrate.

2. The plasma processing apparatus according to claim 1, wherein the gas supply is controlled to supply the etching gas that includes a hydrogen-containing gas and a fluorine-containing gas which form the hydrogen fluoride by generating the plasma or the etching gas that includes hydrogen fluoride to etch the etch film using the hydrogen fluoride.

3. The plasma processing apparatus according to claim 1, wherein the etch film contains silicon, and
   the mask and the protective film contain carbon.

4. The plasma processing apparatus according to claim 3, wherein the mask is formed of an amorphous carbon film.

5. The plasma processing apparatus according to claim 3, wherein the etch film includes a silicon oxide film, a polycrystalline silicon film, a silicon nitride film, or a multilayer film that includes a silicon oxide film and a silicon nitride film.

6. The plasma processing apparatus according to claim 3, wherein the gas supply is controlled to supply a gas containing hydrocarbon to form the protective film.

7. The plasma processing apparatus according to claim 1, wherein the mask is formed of a metal-containing film, and the protective film contains metal.

8. The plasma processing apparatus according to claim 1, wherein the mask and the protective film are formed of polycrystalline silicon or silicon oxide.

9. The plasma processing apparatus according to claim 8, wherein the controller
   (c) controls the gas supply and the plasma generator to generate plasma from a cleaning gas to perform dry cleaning to remove a reaction product deposited on the protective film, together with at least a part of the protective film, after said (b).

10. The plasma processing apparatus according to claim 9, wherein
    the controller performs said (c) to perform the dry cleaning such that the protective film partially remains in a state where the protective film covers the surface in the chamber, and
    the controller further performs said (b) on another substrate, after said (c).

11. The plasma processing apparatus according to claim 9, wherein the controller further performs said (a) after said (c), and further performs said (b) on another substrate.

12. The plasma processing apparatus according to claim 1, wherein said (a) is performed in a state where a dummy substrate is placed on a substrate support in the chamber.

13. The plasma processing apparatus according to claim 1, wherein the process gas further includes a fluorocarbon gas.

14. The plasma processing apparatus according to claim 1, wherein
    the mask includes a metal, and
    a cleaning gas used in the dry cleaning contains at least one selected from a group consisting of $NF_3$, $Cl_2$, $BCl_3$, $SiCl_4$, $O_2$, $CH_3OH$, and $C_2H_5OH$.

15. A plasma processing apparatus comprising:
    a chamber having a plasma processing space therein;
    a substrate support in the plasma processing space in the chamber, the substrate support to support a substrate including a silicon-containing film and a mask on the silicon-containing film;
    a gas supply configured to supply a gas into the plasma processing space in the chamber,
    a plasma generator configured to generate plasma from the gas within the plasma processing space in the chamber; and
    a controller configured to control the gas supply and the plasma generator,
    wherein the controller is configured to
    (a) form a protective film on a surface in the chamber;
    (b) etch the silicon-containing film using hydrogen fluoride and one or more phosphorus-containing molecules within the plasma processing space in the chamber; and
    (c) perform dry cleaning to remove a reaction product deposited on the protective film, together with at least a part of the protective film, after the substrate which is in a state where the upper surface of an underlying region has been exposed by the etching in said (b) is transferred out from the chamber, the mask is formed of a metal-containing film, and
    the protective film is formed using a film forming gas containing a metal.

16. The plasma processing apparatus according to claim 15, wherein the mask contains titanium, titanium nitride, titanium carbide, titanium oxide, tungsten, tungsten carbide, ruthenium, ruthenium oxide, molybdenum, or molybdenum carbide.

17. The plasma processing apparatus according to claim 15, wherein the controller performs a chemical vapor deposition, a metalorganic chemical vapor deposition, or an atomic layer deposition in said (a) using the film forming gas to form the protective film.

18. The plasma processing apparatus according to claim 15, wherein the film forming gas contains $WF_6$, $TiCl_4$, $C_8H_{24}N_4Ti$, $RuCl_3$, or $MoCl_5$.

19. A plasma processing apparatus comprising:
   a chamber;
   a substrate support in the chamber, the substrate support to support a substrate including an underlying region, a silicon-containing film on the underlying region, and a mask on the silicon-containing film, the silicon-containing film being in contact with an upper surface of the underlying region;
   a gas supply configured to supply a gas into the chamber;
   a plasma generator configured to generate plasma from the gas within the chamber; and
   a controller configured to control the gas supply and the plasma generator,
   wherein the controller is configured to
      (a) form a protective film on a surface in the chamber;
      (b) etch the silicon-containing film using hydrogen fluoride within the chamber to expose the upper surface of the underlying region;
      and (c) perform dry cleaning to remove a reaction product deposited on the protective film, together with at least a part of the protective film, after the substrate which is in a state where the upper surface of the underlying region has been exposed by the etching in said (b) is transferred out from the chamber.

* * * * *